United States Patent
Barnum et al.

(10) Patent No.: US 7,761,682 B2
(45) Date of Patent: Jul. 20, 2010

(54) MEMORY CONTROLLER OPERATING IN A SYSTEM WITH A VARIABLE SYSTEM CLOCK

(75) Inventors: Melissa Ann Barnum, Kasson, MN (US); Mark David Bellows, Rochester, MN (US); Paul Allen Ganfield, Rochester, MN (US); Lonny Lambrecht, Byron, MN (US); Tolga Ozguner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/191,195

(22) Filed: Aug. 13, 2008

(65) Prior Publication Data

US 2008/0307184 A1    Dec. 11, 2008

Related U.S. Application Data

(63) Continuation of application No. 11/348,879, filed on Feb. 7, 2006, now Pat. No. 7,467,277.

(51) Int. Cl.
G06F 13/14 (2006.01)
G06F 13/36 (2006.01)

(52) U.S. Cl. .................. 711/167; 711/168; 711/169

(58) Field of Classification Search .................. None
See application file for complete search history.

(56) References Cited

U.S. PATENT DOCUMENTS

| | | | |
|---|---|---|---|
| 5,193,158 A | 3/1993 | Kinney et al. | |
| 6,573,846 B1 | 6/2003 | Trivedi et al. | |
| 6,850,092 B2 * | 2/2005 | Chelcea et al. | 326/93 |
| 6,952,739 B2 | 10/2005 | Fritz et al. | |
| 2007/0139085 A1 * | 6/2007 | Elliot et al. | 327/100 |
| 2007/0183192 A1 | 8/2007 | Barnum et al. | |
| 2007/0186071 A1 | 8/2007 | Bellows et al. | |
| 2007/0220184 A1 * | 9/2007 | Tierno | 710/52 |

OTHER PUBLICATIONS

*Ex Parte Quayle* for U.S. Appl. No. 11/348,879, dated Jan. 8, 2008 (IBMK50461).

* cited by examiner

*Primary Examiner*—Than Nguyen
(74) *Attorney, Agent, or Firm*—Patterson & Sheridan, LLP

(57) ABSTRACT

The present invention generally relates to memory controllers operating in a system containing a variable system clock. The memory controller may exchange data with a processor operating at a variable processor clock frequency. However the memory controller may perform memory accesses at a constant memory clock frequency. Asynchronous buffers may be provided to transfer data across the variable and constant clock domains. To prevent read buffer overflow while switching to a lower processor clock frequency, the memory controller may quiesce the memory sequencers and pace read data from the sequencers at a slower rate. To prevent write data under runs, the memory controller's data flow logic may perform handshaking to ensure that write data is completely received in the buffer before performing a write access.

10 Claims, 3 Drawing Sheets

MEMORY CONTROLLER OPERATING IN A SYSTEM WITH A VARIABLE SYSTEM CLOCK

CROSS-REFERENCE TO RELATED APPLICATIONS

This application is a continuation of U.S. patent application Ser. No. 11/348,879, filed Feb. 7, 2006, now U.S. Pat. No. 7,467,277 which is hereby incorporated by reference in its entirety.

BACKGROUND OF THE INVENTION

1. Field of the Invention

The present invention generally relates to memory controllers. More specifically, the invention relates to memory controllers operating in a system with a variable system clock.

2. Description of the Related Art

A system on a chip (SOC) generally includes one or more integrated processor cores, some type of embedded memory, such as a cache shared between the processor cores, and peripheral interfaces, such as memory control components and external bus interfaces, on a single chip to form a complete (or nearly complete) system. The external bus interface is often used to pass data in packets over an external bus between the SOC and an external device, such as an external memory controller.

The increasing demand for higher processor performance has lead to dramatic increases in clock frequencies of processor cores. As the chips become faster and larger, improving performance while containing power dissipation has become a significant challenge. One solution to conserve power may be to implement multiple clock domains in the processor. A Multiple Clock Domain (MCD) processor may comprise one or more clock domains that run at different frequencies. Moreover, the voltage and frequency for each domain may be independently and dynamically controlled, thereby allowing the selection of frequencies and voltages that conserve energy and maximize performance.

One challenge in implementing such a solution is that memory interfaces typically require a constant frequency. Therefore, the memory controller must be able to accommodate frequency changes in the processor core. For example, the memory controller may contain large command queues to receive read and write commands from the processor in the processor clock domain. The memory controller may also contain memory interface sequencers in the memory clock domain. The memory interface sequencers, for example, may be configured to perform memory accesses such as read and write accesses at a constant frequency in the memory clock domain.

The memory controller may also contain asynchronous read and write buffers configured to exchange data between the different clock domains. For example an asynchronous read buffer may be configured to receive read data from memory in the memory clock domain and send the read data to the processor in the processor clock domain. Similarly, an asynchronous write buffer may receive write data from the processor in the processor clock domain and send the write data to memory in the memory clock domain.

One problem with this solution is that if the frequency of the processor core changes, the buffers may overflow in some instances and under run in other instances. For example, if the processor frequency is reduced with respect to the memory frequency to conserve power, read data from memory may be received in the read buffer at a rate greater than the rate at which the data is read by the processor from the buffer. Therefore, the read buffer may overflow.

On the other hand, with respect to the write buffers, if the processor frequency is slowed relative to the memory frequency, a write buffer under run may occur. For example, write data in the write buffers may be transferred to memory based on assumptions regarding the availability of data in the write buffer. The assumptions, for example, may include the timing for transfer of data from the processor to the write buffer. If the processor frequency is reduced, write data may be transferred to the write buffers at a slower rate, thereby invalidating previous assumptions. In other words, data may not be written fast enough to satisfy timing requirements of the memory device.

Therefore, what is needed are methods and systems for allowing memory controllers to accommodate frequency changes in processors.

SUMMARY OF THE INVENTION

The present invention generally relates to memory controllers operating in a system with a variable system clock.

One embodiment of the invention describes a memory controller. The memory controller generally comprises (i) an asynchronous read buffer configured to receive read data from a memory sequencer driven by a constant memory clock and send the read data to a processor driven by a variable processor clock, (ii) an asynchronous write buffer configured to receive write data from the processor driven by the processor clock and send the write data to the memory sequencer driven by the memory clock, and (iv) data flow logic configured to, in response to receiving a slow mode request from a clock controller, stall processing of read and write commands until all pending read and write commands are completed, determine a rate for issuing read commands, process read commands at the rate after the pending read and write commands are completed, and transfer write data from the asynchronous write buffer to the memory sequencers only if the write data is available in the asynchronous write buffer.

Another embodiment of the invention provides a method for transferring read data from memory driven by a constant memory clock to a processor driven by a variable processor clock by means of an asynchronous read buffer configured to receive read data from memory driven by the memory clock and send read data to the processor driven by the processor clock. The method generally comprises receiving a slow mode request from a clock controller to lower the frequency of the processor clock, in response to receiving the slow mode request, stalling processing of read commands until all pending read commands are completed, determining a rate for issuing read commands, and after the pending read commands are completed, issuing read commands at the determined rate, wherein the determined rate is selected to prevent overflow of the read buffer.

Yet another embodiment of the invention provides a method for transferring write data from a processor driven by a variable processor clock to memory driven by a constant memory clock by means of an asynchronous read buffer configured to receive write data from the processor driven by the processor clock and send write data to the memory driven by the memory clock. The method generally comprises receiving a slow mode request from a clock controller to lower the frequency of the processor clock, in response to receiving the slow mode request, transferring the pending write commands and writing data to memory, and after transferring the pending write commands and write data to memory, writing data to memory only if the write data is available in the asynchronous write buffer.

A further embodiment of the invention provides a system. The system generally comprises memory driven by a constant memory clock, a processor driven by a variable processor clock, configured to issue read and write commands to the memory, a clock controller configured to issue a request for changing the frequency of the processor clock, and change the frequency of the processor clock, and a memory controller. The memory controller generally comprises (i) an asynchronous read buffer configured to receive read data from a memory sequencer driven by the memory clock and send the read data to the processor driven by the processor clock, (ii) an asynchronous write buffer configured to receive write data from the processor driven by the processor clock and send the write data to the memory sequencer driven by the memory clock, and (iii) data flow logic configured to, in response to receiving a slow mode request from a clock controller, stall processing of read and write commands until all pending read and write commands are completed, determine a rate for issuing read commands, process read commands at the rate after the pending read commands are completed, and transfer write data from the asynchronous write buffer to the memory sequencers only if the write data is available in the asynchronous write buffer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention generally relates to memory controllers operating in a system containing a variable system clock. The memory controller may exchange data with a processor operating at a variable processor clock frequency. However the memory controller may perform memory accesses at a constant memory clock frequency. Asynchronous buffers may be provided to transfer data across the variable and constant clock domains. To prevent read buffer overflow while switching to a lower processor clock frequency, the memory controller may quiesce the memory sequencers and pace read data from the sequencers at a slower rate. To prevent write data under runs, the memory controller's data flow logic may perform handshaking to ensure that write data is completely received in the buffer before performing a write access.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

An Exemplary System

Figure 1:
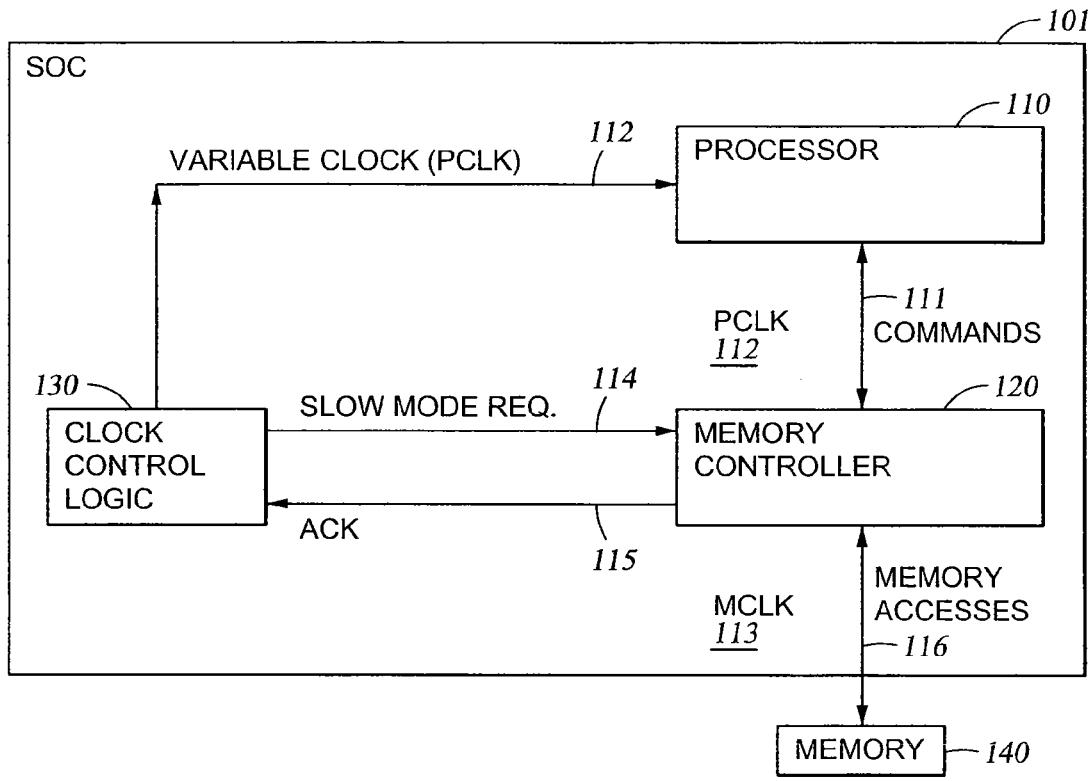
FIG. 1 is an illustration of an exemplary system according to an embodiment of the invention.

FIG. 1 illustrates an exemplary system 100 in which embodiments of the invention may be implemented. System 100 may include an SOC 101 comprising processor 110, Memory controller 120, and clock control logic 130. The system may also comprise memory 140. Memory 140 is preferably a random access memory such as Dynamic Random Access Memory (DRAM) sufficiently large to contain data processed by processor 110.

Processor 110 may be configured to issue commands 111 to memory controller 120 to access memory 140. Commands 111 may include read commands and write commands. For example, commands 111 may include read or write data along with a memory address for a location in memory 140.

Processor 110 may also be configured to operate at variable frequencies to conserve power and maximize performance. For example, processor 110 may initially operate in a clock domain (pclk) at a first frequency. In response to determining that the system is overheating due to high power and energy dissipation at the first frequency, which may damage the system, the processor frequency may be reduced to a second frequency to reduce the power dissipation. The second frequency may be selected to maintain minimum performance requirements while reducing power dissipation. One skilled in the art will recognize, however, that several other reasons for varying frequency such as the different performance requirements for processes may also factor into the decision to vary processor frequency.

Clock control logic 130 may provide a variable clock signal pclk 112 to processor 110. The frequency of operation of the processor may depend on pclk 112. The frequency of pclk may be selected according to power and performance requirements. However, before varying the pclk frequency, clock control logic 130 may be configured to issue a request, for example slow mode request 114 to memory controller 120. After receiving an acknowledge signal 115 from memory controller 120, clock control logic 130 may vary the processor frequency by varying pclk 112.

In response to receiving the slow mode request, memory controller 120 may perform operations according to embodiments of the invention to prevent read buffer overflow and write buffer under writes. The operations performed by the memory controller are described in greater detail below.

Memory controller 114 may also perform memory accesses 116 to memory 140. Memory accesses 116, for example, may be performed in response to receiving commands 111 from processor 110. Memory accesses 116 may include read accesses and write accesses to a given location in memory 140. Memory accesses 116 may be performed at a constant memory clock frequency determined by mclk 113.

The Memory Controller

Figure 2:
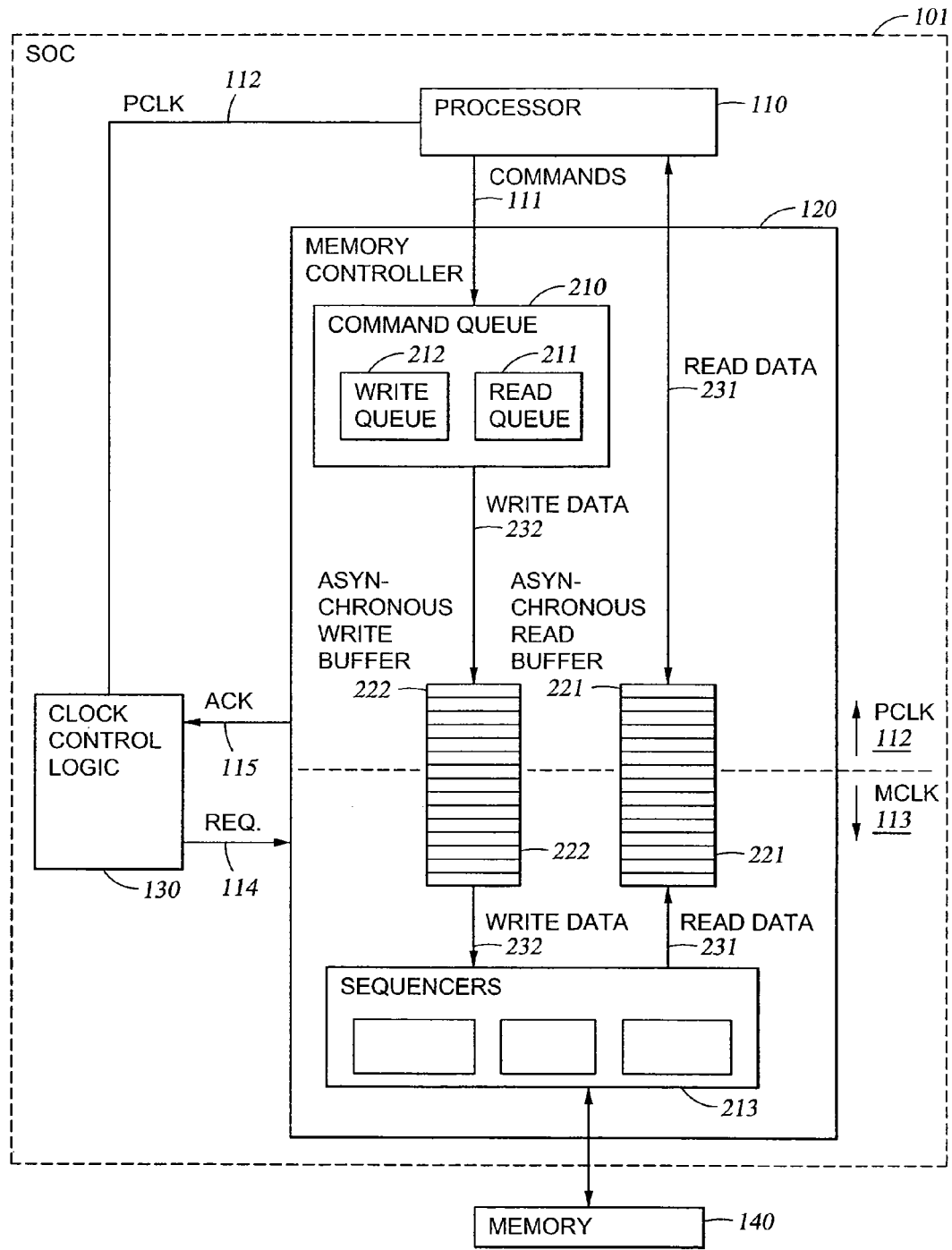
FIG. 2 is an illustration of an exemplary memory controller according to an embodiment of the invention.

FIG. 2 is a detailed illustration of memory controller 120 according to one embodiment of the invention. Memory controller 120 may include a command queue 210, asynchronous read buffer 221, asynchronous write buffer 222, and sequencers 213. Command queue 210 may be configured to receive and store a predetermined number of commands 111 from processor 110. Command queue 210 may be configured to operate in the processor clock (pclk) domain. Therefore, command queue 210 may receive commands at a frequency determined by pclk 112.

Command queue 210 may include a read queue 211 and write queue 212. Read queue 211 may be configured to receive read commands that may be dispatched to sequencers 213 to perform read accesses on memory 140. Write queue 212 may be configured to receive write commands to perform write accesses on memory 140. The data to be written to memory (write data 232), for example, may be transferred to asynchronous write buffer 222 from write queue 212 before performing the write access. Transfer of commands/data from read queue 211 and write queue 212 may be performed in the variable pclk domain.

Asynchronous read buffer 221 may be configured to receive read data 231 from sequencers 213. The read data may be received at a frequency in the memory clock (mclk) domain. Read data 231 in the read buffer may be dispatched to the processor 110 in the processor clock (pclk) domain. Because pclk may be variable, if the frequency of pclk lowers relative to mclk, read data may be written to asynchronous read buffer 221 at a rate faster than the rate at which read data is sent to the processor. Therefore, embodiments of the invention may utilize a pacing algorithm described in greater detail below, to prevent overflow of the asynchronous read buffer 221.

Asynchronous write buffer 222 may be configured to receive write data 232 from write queue 212. The write commands, for example, may include write data along with the address of the location for the write. Write buffer 212 may dispatch write data to sequencers 213 to perform write operations to memory 140.

Write data 232 may be received in write buffer 222 at a frequency determined by variable pclk 112. On the other hand, write commands may be dispatched to the sequencers 213 at a frequency determined by constant mclk 113. If the frequency of pclk is slowed to a rate lower than mclk, sequencers 213 may retrieve write commands from write buffer 222 at a rate greater than the rate at which write commands are transferred to the write buffer from write queue 212. In an effort to avoid write under runs caused by write data being dispatched to sequencers 213 before the write data is completely transferred to the buffer, embodiments of the invention may perform hand shaking across asynchronous write buffer 222. The handshaking algorithm is described in greater detail below.

Sequencers 213 of memory controller 130 may be configured to service commands in command queue 210 by performing memory accesses on memory 140. Memory accesses by sequencers 213 may be performed in the static memory clock (mclk) domain. Servicing a read command, for example, may involve issuing a read signal, waiting a number of clock cycles for a column address strobe (CAS) latency, retrieving data, and waiting for the row to pre-charge. Retrieved read data may be placed in asynchronous read buffer 221.

Servicing a write command may involve issuing a write signal, waiting a number of clock cycles for a CAS latency, bursting data on to a data bus, and waiting for a number of clock cycles for write data recovery and row pre-charge. Bursting data on the bus for example may include retrieving the write data from asynchronous write buffer 222. The sequencer may be further configured to perform memory refresh services involving issuing a refresh signal and waiting a number of clock cycles to refresh memory.

Pacing to Prevent Read Buffer Overflow

As described above, the processor clock frequency pclk may lower with respect to the memory clock frequency, mclk. In such instances, in an effort to prevent read buffer overflow, memory controller 120 may perform a handshake with clock control logic 130 before switching frequencies and pace the issue of read data to asynchronous read buffer 221.

For example, clock control logic 130 may send a slow mode request 114 to memory controller 120. In response to receiving the slow mode request, the memory controller may quiesce sequencers 213. Quiescing the sequencers, for example, may involve holding off on taking any more read commands and allowing outstanding reads to complete. Therefore, quiescing sequencers may involve waiting for all the read and write data in the read buffer to be sent to the processor.

After all the outstanding read and write operations are completed, memory controller 120 may send acknowledge signal 115 to clock control logic 130. In response to receiving the acknowledge signal, the clock control logic may switch pclk to a lower frequency. The memory controller may also begin pacing the issue of read commands. For example, in some embodiments, in response to a slow mode request, the memory controller may issue read commands at a predetermined slowest rate possible. The slowest rate may be any rate sufficiently slow to prevent read buffer overflow.

Issuing commands at the slowest possible rate may involve waiting for a determined number of clock cycles before issuing the next command. In some embodiments a configurable command pacing register containing a value for the predetermined number of clock cycles may be used. In other embodiments, the value in the register may represent a value proportional to the ratio between the new pclk and constant mclk. Therefore, the slower the pclk, the larger the value in the register.

In some embodiments, memory controller 120 may pace the commands at several different slow intermediate frequencies before settling on a final frequency. This may be done to determine a pacing rate that maximizes performance. For example, if the predetermined slowest pacing rate is too slow, thereby adversely affecting performance, the memory controller may switch to a higher intermediate slow frequency that improves performance while preventing buffer overflow.

Figure 3:
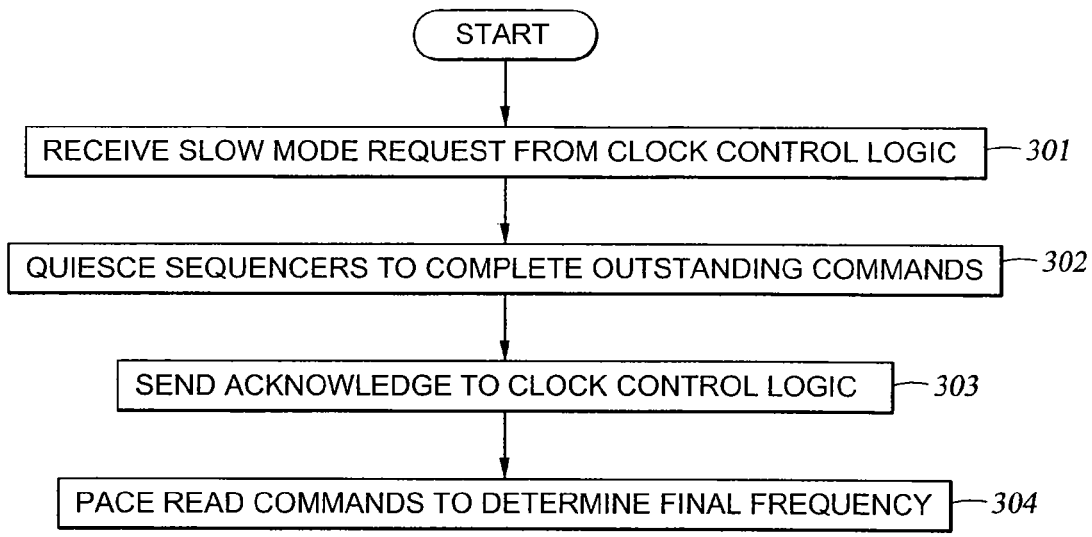
FIG. 3 is a flow diagram of exemplary operations performed by the memory controller to prevent read buffer overflow.

FIG. 3 is a flow diagram of exemplary operations performed by the memory controller to prevent read buffer overflow while switching to a lower pclk frequency. The operations begin in step 301 by receiving a slow mode request from the clock control logic. In response to receiving the slow mode request, the memory controller, in step 302, may quiesce the memory sequencers by holding off on issuing any more read commands and allowing outstanding read commands to complete.

When the outstanding read commands have completed, the memory controller may send an acknowledge to the clock control logic, in step 303. In response to receiving the acknowledge, the clock control logic may switch to a lower pclk frequency. In step 304, the memory controller may pace commands at a determined intermediate slow frequency to prevent read buffer overflow.

Handshaking to Prevent Write Buffer Underrun

As described above, when pclk runs faster than mclk, there is little danger of a write buffer under run because data may be transferred to the buffer faster than the rate at which it is moved out. However, when pclk is slower than mclk, write buffer under runs may occur because the buffer may be read at a rate greater than the rate at which it is being written. For example, write accesses to memory may be performed according to timings determined by the constant mclk. When pclk slows relative to mclk, transfer of data from the write buffer may begin even before the data has been completely moved into the buffer, thereby causing write errors.

Figure 4:
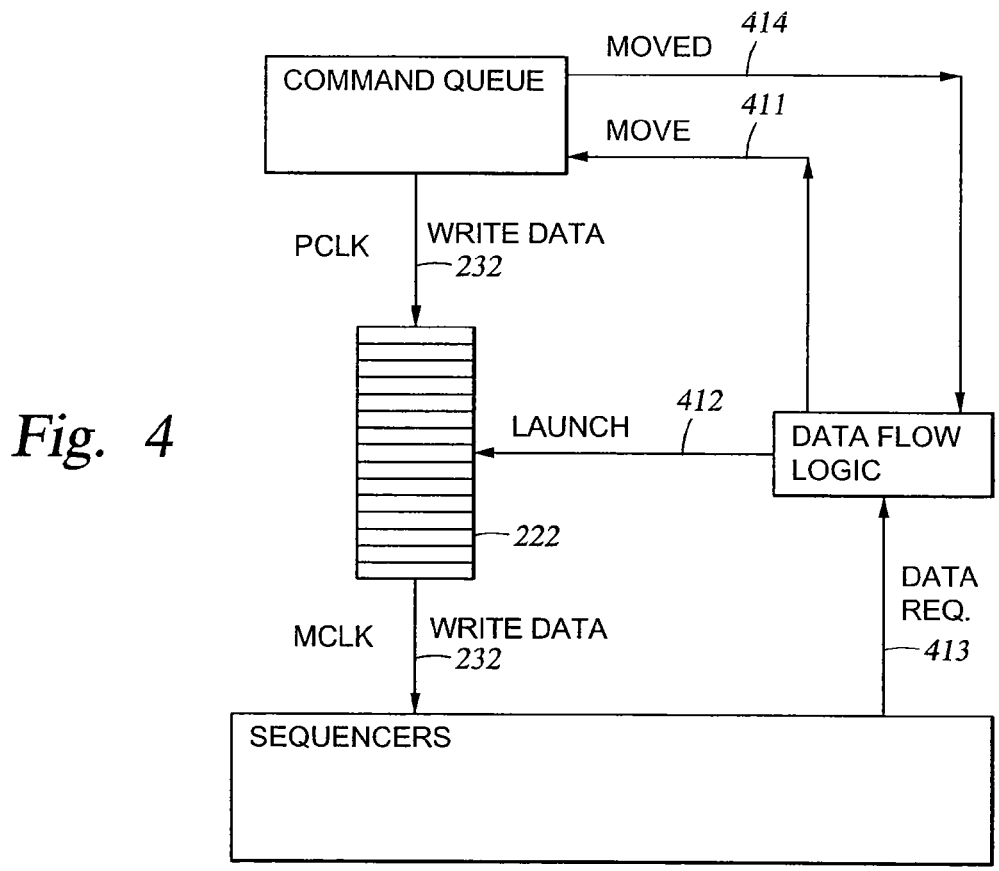
FIG. 4 is an illustration of an asynchronous write buffer according to an embodiment of the invention.

Embodiments of the invention may utilize handshaking when operating in the slow mode to avoid write buffer under run. For example, when the hand shaking between clock control logic 130 and memory controller 120 occurs, sequencers 213 may operate in the slow mode state. FIG. 4 illustrates signals exchanged between command queue 210, asynchronous write buffer 212, sequencers 213 and data flow logic 410 to prevent write buffer under runs in the slow mode.

As illustrated in FIG. 4, data flow logic 410 may move data from the write queue to the asynchronous write buffer by asserting a move signal 411. Therefore, when data flow logic 410 asserts move signal 411, write data 232 for a given command may be transferred from the command queue to asynchronous write buffer 212. The transfer of write data to the write buffer may occur in the slower pclk domain.

Data flow logic 410 may also receive a data request signal 413 from sequencers 213. For example, when the sequencers finish a current memory access operation, one or more sequencers may assert a data request signal to the data flow logic. In response to receiving the data request signal, the data flow logic may issue a launch signal 412 to the asynchronous write buffer to begin transfer of write data 232 to the sequencers.

To prevent write buffer under runs, the data flow logic may not assert the launch signal until the command queue 210 signals that the data has been moved 414. For example, the moved signal 414 may not be asserted until enough data has accumulated in the write buffer to prevent an under run. In some embodiments, launch of write data to the memory sequencers may not begin until the move of write data is complete, thereby preventing write buffer under runs.

Figure 5:
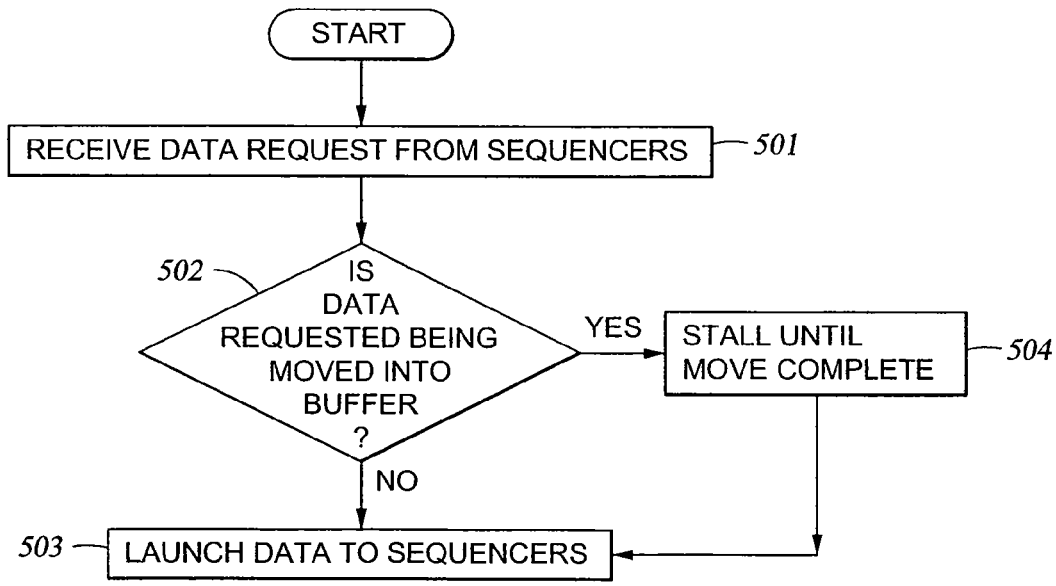
FIG. 5 is a flow diagram of exemplary operations performed by the memory controller to prevent write buffer under runs.

FIG. 5 is a flow diagram of exemplary operations performed by the data flow logic to prevent write buffer under runs. The operations begin in step 501 by receiving a data request from the sequencers. In step 502, the data flow logic may determine whether the data requested has been moved into the asynchronous write buffer.

For example, the data flow logic may determine whether the moved signal is asserted for the data. If the moved signal is asserted, the data may have been completely moved into the write buffer. Therefore, in step 503, the data flow logic may assert the launch signal to transfer the data to the sequencers. However, if in step 502, it is determined that the data has not been completely transferred to the write buffer, the data flow logic may stall until the move has been completed before going to step 503 to launch the data to the sequencers, thus satisfying write timing requirements.

Conclusion

By pacing read data received from memory sequencers and performing handshaking to ensure write data is completely received before performing a write access, embodiments of the invention allow memory controllers to adjust to changing processor clock frequencies. Therefore, the system may be operated at frequencies that allow power and performance requirements to be met.

While the foregoing is directed to embodiments of the present invention, other and further embodiments of the invention may be devised without departing from the basic scope thereof, and the scope thereof is determined by the claims that follow.

What is claimed is:

1. A memory controller, comprising:
   (i) an asynchronous read buffer configured to receive read data from a memory sequencer driven by a constant memory clock and send the read data to a processor driven by a variable processor clock;
   (ii) an asynchronous write buffer configured to receive write data from the processor driven by the processor clock and send the write data to the memory sequencer driven by the memory clock; and
   (iii) data flow logic configured to, in response to receiving a slow mode request from a clock controller, stall processing of read and write commands until all pending read and write commands are completed, determine a rate for issuing read commands, process read commands at the rate after the pending read and write commands are completed, and transfer write data from the asynchronous write buffer to the memory sequencers only if the write data is available in the asynchronous write buffer.

2. The memory controller of claim 1, wherein the data flow logic is further configured to send an acknowledge signal to the clock controller after the pending read and write commands are completed to change the frequency of the processor clock.

3. The memory controller of claim 1, wherein the data flow logic is configured to process read commands at the determined rate by waiting for a predetermined number of clock cycles before issuing a read command for processing.

4. The memory controller of claim 1, wherein the data flow logic is configured to determine whether write data is available in the asynchronous write buffer by determining whether a moved signal is asserted, wherein the moved signal indicates that the write data is being transferred to the asynchronous write buffer driven by the processor clock.

5. The memory controller of claim 4, wherein the data flow logic is configured to transfer write data from the write buffer to memory driven by the memory clock by asserting a launch signal, wherein the launch signal is asserted if the moved signal is asserted.

6. A system, comprising:
   memory driven by a constant memory clock;
   a processor driven by a variable processor clock, configured to issue read and write commands to the memory;
   a clock controller configured to issue a request for changing the frequency of the processor clock, and change the frequency of the processor clock; and
   a memory controller comprising:
   (i) an asynchronous read buffer configured to receive read data from a memory sequencer driven by the memory clock and send the read data to the processor driven by the processor clock;
   (ii) an asynchronous write buffer configured to receive write data from the processor driven by the processor clock and send the write data to the memory sequencer driven by the memory clock; and (iii) data flow logic configured to, in response to receiving a slow mode request from a clock controller, stall processing of read and write commands until all pending read and write commands are completed, determine a rate for issuing read commands, process read commands at the rate after the pending read commands are completed, and transfer write data from the asynchronous write buffer to the memory sequencers only if the write data is available in the asynchronous write buffer.

7. The system of claim 6 wherein the data flow logic is further configured to send an acknowledge signal to the clock controller after the pending read and write commands are completed to change the frequency of the processor clock.

8. The system of claim 6, wherein the data flow logic is configured to process read commands at the determined rate by waiting for a predetermined number of clock cycles before issuing the read command for processing.

9. The system of claim 6, wherein the data flow logic is configured to determine whether write data is available in the asynchronous write buffer by determining whether a moved signal is asserted, wherein the moved signal indicates that the write data has been transferred to the asynchronous write buffer driven by the processor clock.

10. The system of claim 9, wherein the data flow logic is configured to transfer write data from the write buffer to memory driven by the memory clock by asserting a launch signal, wherein the launch signal is asserted if the moved signal has been asserted.

* * * * *